(12) United States Patent
Uetani et al.

(10) Patent No.: US 9,362,515 B2
(45) Date of Patent: Jun. 7, 2016

(54) PHOTOELECTRIC CONVERSION ELEMENT

(75) Inventors: Yasunori Uetani, Tsukuba (JP); Yoshiaki Honda, Tsukuba (JP); Yukiko Takenaka, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/002,584

(22) PCT Filed: Jul. 7, 2009

(86) PCT No.: PCT/JP2009/062645
§ 371 (c)(1),
(2), (4) Date: Jan. 4, 2011

(87) PCT Pub. No.: WO2010/005094
PCT Pub. Date: Jan. 14, 2010

(65) Prior Publication Data
US 2011/0108884 A1  May 12, 2011

(30) Foreign Application Priority Data

Jul. 8, 2008 (JP) ................................. 2008-177644
Nov. 25, 2008 (JP) ................................. 2008-299268

(51) Int. Cl.
H01L 31/102 (2006.01)
H01L 51/42 (2006.01)
B82Y 10/00 (2011.01)
H01L 51/00 (2006.01)

(52) U.S. Cl.
CPC ............. *H01L 51/4253* (2013.01); *B82Y 10/00* (2013.01); *H01L 51/0036* (2013.01); *H01L 51/0039* (2013.01); *H01L 51/0043* (2013.01); *H01L 51/0047* (2013.01); *Y02E 10/549* (2013.01)

(58) Field of Classification Search
CPC . H01L 51/00; H01L 51/0036; H01L 51/4253; H01L 31/109; Y02E 10/549
USPC ................. 257/184, 85, 94; 136/263
See application file for complete search history.

(56) References Cited

U.S. PATENT DOCUMENTS

| | | | | |
|---|---|---|---|---|
| 4,758,634 | A * | 7/1988 | Jenekhe .......................... | 525/398 |
| 6,903,506 | B2 * | 6/2005 | Kita et al. ...................... | 313/506 |
| 7,830,089 | B2 * | 11/2010 | Murano et al. ................. | 313/506 |
| 2002/0171087 | A1 * | 11/2002 | Krames et al. .................. | 257/81 |
| 2003/0129436 | A1 * | 7/2003 | Ramm et al. ................... | 428/519 |
| 2005/0227390 | A1 * | 10/2005 | Shtein et al. ..................... | 438/22 |
| 2006/0076050 | A1 * | 4/2006 | Williams et al. .............. | 136/263 |
| 2007/0063156 | A1 * | 3/2007 | Hayashi ..................... | 250/559.07 |
| 2007/0119497 | A1 * | 5/2007 | Umemoto et al. ............. | 136/252 |
| 2007/0178619 | A1 * | 8/2007 | Forrest et al. ................... | 438/57 |
| 2009/0107539 | A1 * | 4/2009 | Musha et al. ................. | 136/244 |
| 2009/0165857 | A1 * | 7/2009 | Naito et al. .................... | 136/261 |
| 2010/0132782 | A1 * | 6/2010 | Laird et al. .................... | 136/256 |
| 2010/0193033 | A1 * | 8/2010 | Uetani ........................... | 136/263 |
| 2011/0108884 | A1 * | 5/2011 | Uetani et al. .................. | 257/184 |
| 2011/0259409 | A1 * | 10/2011 | Naito et al. .................... | 136/255 |
| 2012/0042953 | A1 * | 2/2012 | Nishimura et al. ........... | 136/263 |
| 2012/0060927 | A1 * | 3/2012 | Onaka et al. .................. | 136/263 |
| 2012/0085411 | A1 * | 4/2012 | Isobe et al. ..................... | 136/263 |

FOREIGN PATENT DOCUMENTS

| | | |
|---|---|---|
| EP | 2067806 A1 | 6/2009 |
| JP | 2008-106239 A | 5/2008 |
| JP | 2008-141103 A | 6/2008 |
| JP | 2008-266459 A | 6/2008 |
| JP | 2008-536317 A | 9/2008 |
| WO | 2006/110429 A2 | 10/2006 |
| WO | 2009/022733 A1 | 2/2009 |

OTHER PUBLICATIONS

Dennler, Gilles; Sariciftci, N.S., "Flexible Conjugated Polymer-Based Plastic Solar Cells: From Basics to Applications," Proceedings of the IEEE , vol. 93, No. 8, pp. 1429,1439, Aug. 2005.*
M. Hiramoto et al., "Three-layered organic solar cell with a photoactive interlayer of codeposited pigments" Applied Physics Letters, 58, 062-1064 (1991).
Chinese Office Action issued on Jan. 28, 2013 by the Chinese Patent Office in CN Application No. 200980126167.X.
Chinese Office Action issued in corresponding CN Application No. 200980126167.X, dated Jul. 4, 2013.

* cited by examiner

*Primary Examiner* — Thao X Le
*Assistant Examiner* — Laura Dykes
(74) *Attorney, Agent, or Firm* — Sughrue Mion, PLLC

(57) ABSTRACT

Disclosed is a photoelectric conversion element comprising an anode, a cathode, and an active layer between the anode and the cathode, wherein the active layer includes an n-type semiconductor and a p-type semiconductor, and an area of a p-n junction between the n-type semiconductor and the p-type semiconductor is 100 $\mu m^2$ or more per 1 $\mu m^3$ of the active layer.

6 Claims, No Drawings

PHOTOELECTRIC CONVERSION ELEMENT

CROSS REFERENCE TO RELATED APPLICATIONS

This application is a National Stage of International Application No. PCT/JP2009/062645 filed Jul. 7, 2009, which claims priority from Japanese Patent Application No. 2008-177644 filed Jul. 8, 2008, and Japanese Patent Application No. 2008-299268 filed Nov. 25, 2008, the contents of all of which are incorporated herein by reference in their entirety.

TECHNICAL FIELD

The present invention relates to a photoelectric conversion element.

BACKGROUND ART

Recently, attention is being paid to an organic photoelectric conversion element utilizing light energy (organic solar cells, light sensors, and the like). Particularly, attention is being paid to a bulk heterojunction-type solar cell having an active layer containing an n-type semiconductor and a p-type semiconductor (Applied Physics Letters, Vol. 58 (1991) pp. 1062).

DISCLOSURE OF THE INVENTION

However, conditions for increasing photoelectric conversion efficiency of a bulk heterojunction-type photoelectric conversion element, like the above bulk heterojunction-type solar cell, were not necessarily apparent.

Thus, an object of the present invention is to provide a photoelectric conversion element having high photoelectric conversion efficiency.

The present invention firstly provides a photoelectric conversion element including an anode, a cathode, and an active layer between the anode and the cathode, wherein the active layer includes an n-type semiconductor and a p-type semiconductor, and an area of a p-n junction between the n-type semiconductor and the p-type semiconductor is 100 $\mu m^2$ or more per 1 $\mu m^3$ of the active layer.

The present invention secondly provides the photoelectric conversion element, wherein the area of the p-n junction is 300 $\mu m^2$ or less per 1 $\mu m^3$ of the active layer.

The present invention thirdly provides the photoelectric conversion element, wherein the active layer contains a polymer compound.

The present invention fourthly provides the photoelectric conversion element, wherein the active layer contains a fullerene derivative and a polymer compound.

MODE FOR CARRYING OUT THE INVENTION

Hereinafter, the present invention will be described in detail.

The active layer of the photoelectric conversion element of the present invention is formed of a mixture of an n-type semiconductor which is an electron-accepting compound, and a p-type semiconductor which is an electron-donating compound, and has a bulk heterojunction structure.

In the bulk heterojunction structure, a p-n junction is formed in an active layer by phase separation between the n-type semiconductor and the p-type semiconductor included in the active layer. In the photoelectric conversion element of the present invention, an area of the p-n junction per 1 $\mu m^3$ of the active layer is 100 $\mu m^2$ or more. Since photoinduced charge separation occurs at the p-n junction, photoinduced charge separation is likely to occur by controlling the area of the p-n junction to 100 $\mu m^2$ or more, and thus photoelectric conversion efficiency increases. The area of the p-n junction is preferably 115 $\mu m^2$ or more, and more preferably 130 $\mu m^2$ or more. Since a conventional photoelectric conversion element exhibits a small area of the p-n junction of the active layer, photoinduced charge separation is less likely to occur and sufficient photoelectric conversion efficiency could not be obtained.

In case the area of the p-n junction is too large, the active layer has a fine phase separation structure and the region of each of n-type and p-type phases is finely divided and thus disorder of charge transfer tends to occur inside the n-type semiconductor or the p-type semiconductor. The area of the p-n junction is preferably 300 $\mu m^2$ or less, and more preferably 250 $\mu m^2$ or less, per 1 $\mu m^3$ of the active layer.

The method for measuring the area of the p-n junction includes a method in which the area is determined by two-dimensional observation of an active layer using a transmission electron microscope (TEM). It is possible to separately observe a p-type semiconductor and an n-type semiconductor by observing images peculiar to elements included in the n-type semiconductor and/or the p-type semiconductor using TEM. Examples of images peculiar to elements include element mapping images by energy filter TEM, energy-loss images using an energy value that imparts the same contrast as that of the element mapping images, and element mapping images by energy dispersive X-ray analysis (STEM-EDX) using a scanning transmission electron microscope. The area of the p-n junction can be calculated by carrying out a binarization treatment of images in which a bright phase is converted into a white tone and a dark phase is converted into a black color tone by comparing a p-type semiconductor phase with an n-type semiconductor phase.

It is also possible to determine the area of the p-n junction using three-dimensional tomographyimage of TEM.

The active layer of the photoelectric conversion element of the present invention can be produced, for example, by an application method using a solution prepared by dissolving a p-type semiconductor and/or an n-type semiconductor in a solvent.

In this case, one of factors for determining the area of the p-n junction includes solubility of a p-type semiconductor in a solvent and solubility of an n-type semiconductor in a solvent. The solubility of the p-type semiconductor in 100 parts by weight of the solvent is preferably from 0.1 to 10 parts by weight. The solubility of the n-type semiconductor in 100 parts by weight of the solvent is preferably from 5 to 20 parts by weight. When the solubility is too high, phase separation between the n-type semiconductor phase and the p-type semiconductor phase becomes fine and mobility of charges tends to become worse. In contrast, when the solubility is too low, phase separation becomes coarse and charge separation tends to become worse.

Examples of the electrode (anode and/or cathode) included in the photoelectric conversion element of the present invention include electrodes containing metal, electrodes containing an organic transparent electrically conductive film of polyaniline and derivatives thereof, polythiophene and derivatives thereof, and the like, and preferably electrodes containing metal.

Examples of the metal in electrodes containing metal include lithium, beryllium, sodium, magnesium, aluminum, potassium, calcium, scandium, titanium, vanadium, chromium, manganese, iron, cobalt, nickel, copper, zinc, gallium, germanium, rubidium, strontium, yttrium, zirconium, niobium, molybdenum, ruthenium, rhodium, palladium, silver, cadmium, indium, tin, antimony, cesium, barium, lanthanum, hafnium, tantalum, tungsten, rhenium, osmium, iridium, platinum, gold, mercury, thallium, lead, bismuth and lanthanide. It is also possible to use, for example, an alloy of these metals, graphite or an intercalation compound of these metals with graphite. Among these metals, aluminum, magnesium, titanium, chromium, iron, nickel, copper, zinc, gallium, zirconium, molybdenum, silver, indium and tin are preferred.

Examples of electrodes containing metal include electrodes made of metal, and electrodes containing an electrically conductive metal oxide film. The electrode made of metal may contain, in addition to metal, metal oxides and metal halides. However, on the assumption that the weight of metal is 100, the total of the weight of metal oxides and the weight of metal halides is preferably 10 or less, and the electrodes are more preferably substantially made of only metal.

Examples of the metal oxide in electrodes containing an electrically conductive metal oxide film include indium oxide, zinc oxide, tin oxide, and indium tin oxide (ITO) and indium zinc oxide as a composite thereof.

The method of preparing the electrode includes a vacuum vapor deposition method, a sputtering method, an ion plating method, a plating method, and the like. Alternatively, an electrode can be prepared by an application method using a metal ink, a metal paste, low-melting metal, an ink containing an organic substance, or the like.

The photoelectric conversion element of the present invention is usually formed on a substrate. Preferably, the substrate does not deform when an electrode is formed or when layers containing organic substances are formed. Examples of a material for the substrate include glass, plastics, polymer films and silicon. In the case of using an opaque substrate, an opposite electrode (i.e., an electrode distant from the substrate) is preferably transparent or translucent.

Examples of a transparent or translucent electrode material include an electrically conductive metal oxide film and a translucent metal thin film. Specifically, films (NESA, etc.) formed using electrically conductive materials such as indium oxide, zinc oxide, tin oxide, and indium tin oxide (ITO) and indium zinc oxide as a composite thereof, gold, platinum, silver, copper and the like are used, and ITO, indium zinc oxide and tin oxide are preferred.

The actuating mechanism of the photoelectric conversion element will be explained. The light energy incident from a transparent or translucent electrode is absorbed by an electron-accepting compound and/or an electron-donating compound to generate an exciton consisting of an electron and a hole bound to each other. When the generated exciton moves and reaches a heterojunction interface in which the electron-accepting compound and the electron-donating compound are present adjacently, the electron and the hole separate due to the difference of their HOMO energy and LUMO energy in the interface to generate charges (electron and hole) capable of moving separately. The generated charges can move to respective electrodes to be taken outside as an electric energy (current).

The photoelectric conversion element of the present invention includes an active layer containing an electron-accepting compound and an electron-donating compound between an anode and a cathode. The electron-accepting compound usually corresponds to an n-type semiconductor. The electron-donating compound usually corresponds to a p-type semiconductor.

The electron-accepting compound used suitably for the photoelectric conversion element is one in which the HOMO energy of the electron-accepting compound is higher than the HOMO energy of the electron-donating compound, and the LUMO energy of the electron-accepting compound is higher than the LUMO energy of the electron-donating compound.

The electron-donating compound may be a low-molecular compound or a polymer compound. Examples of the low-molecular compound include phthalocyanine, metallophthalocyanine, porphyrin, metalloporphyrin, oligothiophene, tetracene, pentacene and rubrene. Examples of the polymer compound include polyvinyl carbazole and derivatives thereof, polysilane and derivatives thereof, polysiloxane derivatives having an aromatic amine in a side chain or a main chain, polyaniline and derivatives thereof, polythiophene and derivatives thereof, polypyrrole and derivatives thereof, polyphenylene vinylene and derivatives thereof, polythienylene vinylene and derivatives thereof, and polyfluorene and derivatives thereof. In particular, the polymer compound is preferred, and a conjugated polymer compound is more preferred.

The electron-accepting compound may be a low-molecular compound or a polymer compound. Examples of the low-molecular compound include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes such as $C_{60}$ and derivatives thereof, and phenanthrene derivatives such as 2,9-dimethyl-4,7-diphenyl-1,10-phenanthroline. Examples of the polymer compound include polyvinyl carbazole and derivatives thereof, polysilane and derivatives thereof, polysiloxane derivatives having an aromatic amine in a side chain or a main chain, polyaniline and derivatives thereof, polythiophene and derivatives thereof, polypyrrole and derivatives thereof, polyphenylene vinylene and derivatives thereof, polythienylene vinylene and derivatives thereof, and polyfluorene and derivatives thereof. In particular, fullerenes and derivatives thereof are preferred.

The fullerenes include fullerenes such as $C_{60}$, $C_{70}$ and carbon nanotube, and derivatives thereof. The following compounds are mentioned as examples of $C_{60}$ fullerene derivatives.

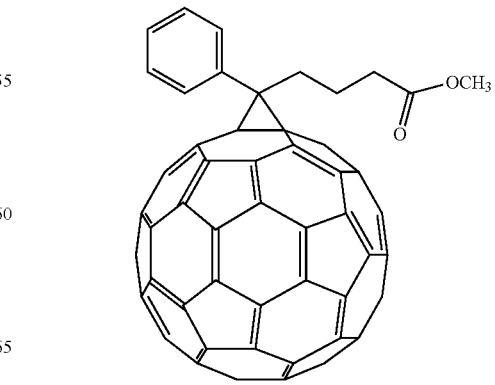

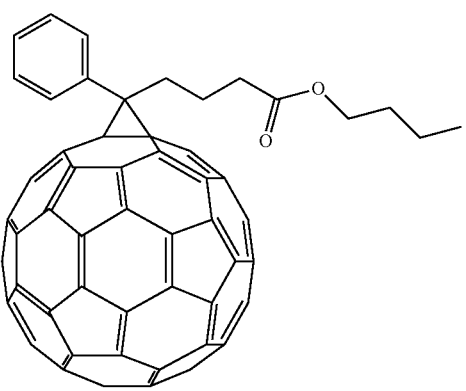
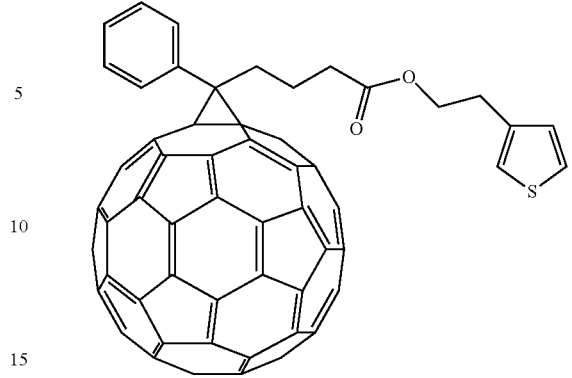
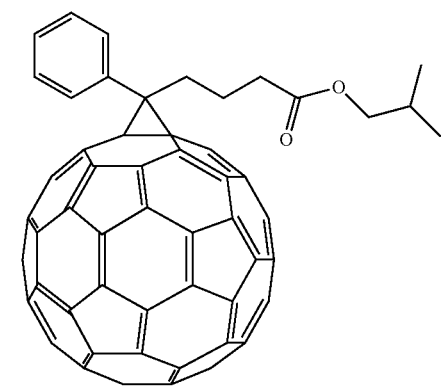

In the case of using a fullerene derivative as the electron-accepting compound, the proportion of the fullerene derivative in the active layer containing the fullerene derivative and an electron-donating compound is preferably from 10 to 1,000 parts by weight, and more preferably 50 to 500 parts by weight, based on 100 parts by weight of the electron-donating compound.

The active layer in the photoelectric conversion element of the present invention preferably contains a polymer compound, and may contain a single polymer compound, or two or more polymer compounds. In particular, a conjugated polymer compound and a fullerene derivative are preferably contained in the active layer. For example, it is possible to use an organic thin film containing a conjugated polymer compound and a fullerene derivative as an active layer.

Examples of the conjugated polymer compound include polymer compounds which contain, as a repeating unit, one or two or more groups selected from the group consisting of an unsubstituted or substituted fluorenediyl group, an unsubstituted or substituted benzofluorenediyl group, a dibenzofurandiyl group, an unsubstituted or substituted dibenzothiophenediyl group, an unsubstituted or substituted carbazolediyl group, an unsubstituted or substituted thiophenediyl group, an unsubstituted or substituted furandiyl group, an unsubstituted or substituted pyrrolediyl group, an unsubstituted or substituted benzothiadiazolediyl group, an unsubstituted or substituted phenylenevinylenediyl group, an unsubstituted or substituted thienylenevinylenediyl group, and an unsubstituted or substituted triphenylaminediyl group, the repeating unit being bound to another repeating unit directly or via a linking group.

In the case where the repeating unit is bound to another repeating unit via a linking group in the conjugated polymer compound, examples of the linking group include phenylene, biphenylene, naphthalenediyl and anthracenediyl.

Preferable examples of the conjugated polymer compound include polymer compounds having a fluorenediyl group, and polymer compounds which contain one or two or more repeating units selected from the group consisting of a thiophenediyl group, the repeating unit being bound to another repeating unit directly or via a linking group.

The organic thin film usually has a film thickness within a range from 1 nm to 100 μm, preferably from 2 nm to 1,000 nm, more preferably from 5 nm to 500 nm, and still more preferably from 20 nm to 200 nm.

The method for forming an organic thin film used in the active layer includes, for example, a method for forming a film from a solution containing a solvent, a conjugated polymer compound and a fullerene derivative. It is possible to use application methods such as a spin coating method, a casting method, a microgravure coating method, a gravure coating method, a bar coating method, a roll coating method, a wire bar coating method, a dip coating method, a spray coating method, a screen printing method, a flexographic printing method, an offset printing method, an ink jet printing method, a dispenser printing method, a nozzle coating method and a capillary coating method in the formation of a film from a solution. Among them, a spin coating method, a flexographic printing method, an ink jet printing method and a dispenser printing method are preferred.

Examples of the solvent include hydrocarbon solvents such as toluene, xylene, mesitylene, tetralin, decalin, bicyclohexyl, n-butylbenzene, s-butylbenzene and t-butylbenzene; halogenated saturated hydrocarbon solvents such as carbon tetrachloride, chloroform, dichloromethane, chlorobutane, bromobutane, chloropentane, bromopentane, chlorohexane, bromohexane, chlorocyclohexane and bromocyclohexane; halogenated unsaturated hydrocarbon solvents such as chlorobenzene, dichlorobenzene and trichlorobenzene; and ether solvents such as tetrahydrofuran and tetrahydropyran.

The solvent used in the present invention may include two or more kinds of solvents, or may contain two or more kinds of solvents shown above.

The photoelectric conversion element of the present invention may further include an inorganic layer between the electrode and the active layer. Examples of a material contained in the inorganic layer include metal oxides such as titanium oxide, tin oxide, zinc oxide, iron oxide, tungsten oxide, zirconium oxide, hafnium oxide, strontium oxide, indium oxide, cerium oxide, yttrium oxide, lanthanum oxide, vanadium oxide, niobium oxide, tantalum oxide, gallium oxide, nickel oxide, strontium titanate, barium titanate, potassium niobate and sodium tantalite; metal halides such as silver iodide, silver bromide, copper iodide, copper bromide and lithium fluoride; metal sulfides such as zinc sulfide, titanium sulfide, indium sulfide, bismuth sulfide, cadmium sulfide, zirconium sulfide, tantalum sulfide, molybdenum sulfide, silver sulfide, copper sulfide, tin sulfide, tungsten sulfide and antimony sulfide; metal selenides such as cadmium selenide, zirconium selenide, zinc selenide, titanium selenide, indium selenide, tungsten selenide, molybdenum selenide, bismuth selenide and lead selenide; metal tellurides such as cadmium telluride, tungsten telluride, molybdenum telluride, zinc telluride and bismuth telluride; metal phosphates such as zinc phosphate, gallium phosphate, indium phosphate and cadmium phosphate; gallium arsenide, copper-indium-selenide, copper-indium-sulfide, silicon and germanium. Further, the material may also be a mixture of two or more of them. Examples of the mixture include a mixture of zinc oxide and tin oxide, and a mixture of tin oxide and titanium oxide.

The photoelectric conversion element of the present invention can generate photovoltaic power between electrodes by irradiating with light such as solar light through transparent or translucent electrodes, and can operate as a thin film solar cell. By accumulating a plurality of thin film solar cells, it can also be used as a thin film solar cell module.

Photocurrent can flow by irradiating with light through transparent or translucent electrodes in a state of applying voltage between the electrodes, and the photoelectric conversion element can operate as a light sensor. By accumulating a plurality of organic light sensors, it can also be used as an image sensor.

EXAMPLES

Hereinafter, the present invention will be described in more detail by way of examples, but the present invention is not limited thereto.

In the following examples, the polystyrene-equivalent number average molecular weight and the weight average molecular weight of the polymer were determined by using GPC (PL-GPC2000) manufactured by GPC Laboratory. Polymers were dissolved in o-dichlorobenzene so as to give solutions each having a concentration of about 1% by weight, which were used to prepare measurement samples. As a mobile phase of the GPC, o-dichlorobenzene was used. The measurement samples were allowed to flow at a flow rate of 1 mL/min at a measurement temperature of 140° C. As a column, three PLGEL 10 μm MIXED-B columns (manufactured by PL Laboratory) connected in series were used.

Synthesis Example 1

Synthesis of Polymer Compound 1

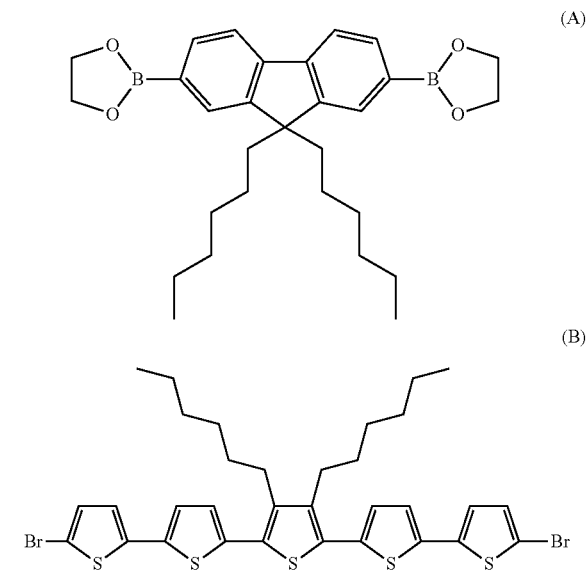

Compound A (7.928 g, 16.72 mmol), Compound B (13.00 g, 17.60 mmol), methyltrioctylammonium chloride (trade name: aliquat 336, manufactured by Aldrich, $CH_3N[(CH_2)_7CH_3]_3Cl$, density 0.884 g/ml, 25° C., registered trademark) (4.979 g), and toluene (405 ml) were charged in an argon-substituted 2 L four-necked flask, and the inside of the flask was degassed by argon-bubbling for 30 minutes with stirring.

Dichlorobis(triphenylphosphine)palladium (II) (0.02 g) was added and heated to 105° C., and then 2 mol/L of an aqueous sodium carbonate solution (42.2 ml) was added dropwise with stirring. After completion of the dropwise addition, the reaction was conducted for 5 hours and phenylboronic acid (2.6 g) and toluene (1.8 ml) were added, followed by stirring at 105° C. for 16 hours. Then, Toluene (700 ml) and a 7.5% aqueous solution of sodium diethyldithiocarbamate trihydrate (200 ml) were added, followed by stirring at 85° C. for 3 hours. After removing the aqueous layer, the organic layer was washed twice with 300 ml of ion-exchange water at 60° C., washed once with 300 ml of 3% acetic acid at 60° C., and then washed thrice with 300 ml of ion-exchange water at 60° C. The organic layer was passed through a column filled with Celite, alumina and silica, and the column was washed with hot toluene (800 ml). The resulting solution was concentrated to a volume of 700 ml and poured into 2 L of methanol to obtain a polymer by reprecipitation.

The polymer was obtained by filtration, washed in turn with 500 ml of methanol, acetone and methanol, and then vacuum-dried overnight at 50° C. to obtain 12.21 g of a pentathienyl-fluorene copolymer (hereinafter referred to as a "polymer compound 1") represented by the following formula:

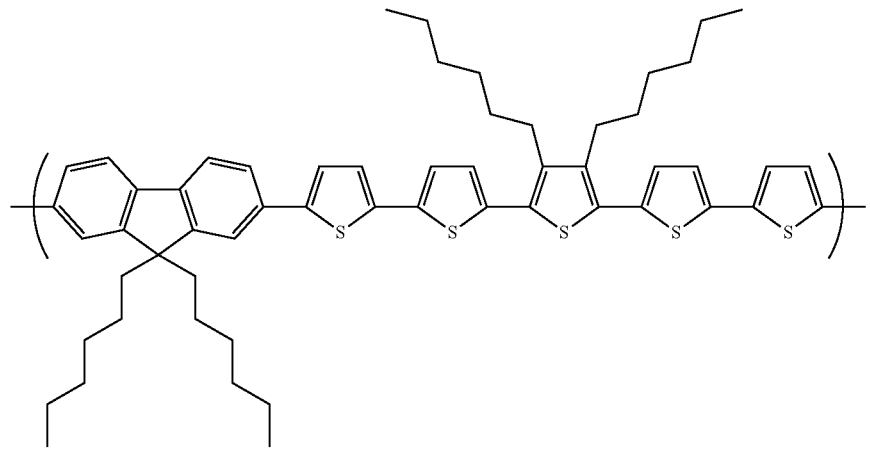

The polystyrene-equivalent number average molecular weight of the polymer compound 1 was $5.4 \times 10^4$ and the weight average molecular weight was $1.1 \times 10^5$.

(Preparation of Composition 1)

[6,6]-Phenyl C61-butyric acid methyl ester (C60PCBM) (15 parts by weight) (E100, manufactured by Frontier Carbon) as a fullerene derivative which is an n-type semiconductor, 5 parts by weight of the polymer compound 1 as an electron-donating compound which is a p-type semiconductor, and 1,000 parts by weight of o-dichlorobenzene as a solvent were mixed. Then, the mixed solution was filtrated through a Teflon (registered trademark) filter having a pore size of 1.0 µm to prepare a composition 1.

(Preparation of Composition 2)

[6,6]-Phenyl C61-butyric acid methyl ester (C60PCBM) (5 parts by weight) (E100, manufactured by Frontier Carbon) as a fullerene derivative, 5 parts by weight of the polymer compound 1 as an electron-donating compound, and 1,000 parts by weight of o-dichlorobenzene as a solvent were mixed. Then, the mixed solution was filtrated through a Teflon (registered trademark) filter having a pore size of 1.0 µm to prepare a composition 2.

(Preparation of Composition 3)

[6,6]-Phenyl C61-butyric acid methyl ester (C60PCBM) (15 parts by weight) (E100, manufactured by Frontier Carbon) as a fullerene derivative, 5 parts by weight of the polymer compound 1 as an electron-donating compound, and 1,000 parts by weight of chlorobenzene as a solvent were mixed. Then, the mixed solution was filtrated through a Teflon (registered trademark) filter having a pore size of 1.0 µm to prepare a composition 3.

(Preparation of Composition 4)

[6,6]-Phenyl C61-butyric acid methyl ester (C60PCBM) (15 parts by weight) (E100, manufactured by Frontier Carbon) as a fullerene derivative, 5 parts by weight of the polymer compound 1 as an electron-donating compound, and 1,000 parts by weight of xylene as a solvent were mixed. Then, the mixed solution was filtered through a Teflon (registered trademark) filter having a pore size of 1.0 µm to prepare a composition 4.

(Preparation of Composition 5)

C70PCBM (15 parts by weight) (Phenyl C71-butyric acid methyl ester, manufactured by American Dye Source under the trade name of ADS71BFA, lot No. 07L022E) as a fullerene derivative, 5 parts by weight of the polymer compound 1 as an electron-donating compound, and 1,000 parts by weight of o-dichlorobenzene as a solvent were mixed. Then, a silica gel (Wakogel C-300 (particle size: 45 to 75 µm), manufactured by Wako Pure Chemical Industries, Ltd.) was added in the amount of 1% by weight based on the weight of the solution, followed by stirring at 23° C. for 12 hours. After completion of the stirring, the silica gel in the solution was removed by filtration through a Teflon (registered trademark) filter having a pore size of 1.0 µm to prepare a composition 5.

Example 1

Preparation and Evaluation of Organic Thin Film Solar Cell

A glass substrate having a 150 nm-thick ITO film formed by a sputtering method was surface-treated by subjecting to an ozone UV treatment. Next, the composition 1 was applied by a spin coating to obtain an active layer (film thickness of about 100 nm) of an organic thin film solar cell. Then, lithium fluoride was vapor-deposited in a thickness of 4 nm by a vacuum deposition machine and Al was vapor-deposited in a thickness of 100 nm. The degree of vacuum upon the vapor deposition was 1 to 9×10⁻³ Pain all cases. The shape of the obtained organic thin film solar cell was a regular tetragon measuring 2 mm×2 mm. The photoelectric conversion efficiency of the obtained organic thin film solar cell was determined by irradiating with constant light using Solar Simulator (manufactured by Bunkoukeiki Co., Ltd. under the trade name of OTENTO-SUN II: AM1.5G filter, irradiance: 100 mW/cm$^2$), and measuring the current and voltage generated. The measurement results are shown in Table 1.

Example 2

Preparation and Evaluation of Organic Thin Film Solar Cell

In the same manner as in Example 1, except that the composition 2 was used in place of the composition 1, an organic thin film solar cell was prepared, and photoelectric conversion efficiency was measured. The measurement results are shown in Table 1.

Comparative Example 1

Preparation and Evaluation of Organic Thin Film Solar Cell

In the same manner as in Example 1, except that the composition 3 was used in place of the composition 1, an organic thin film solar cell was prepared, and photoelectric conversion efficiency was measured. The measurement results are shown in Table 1.

Comparative Example 2

Preparation and Evaluation of Organic Thin Film Solar Cell

In the same manner as in Example 1, except that the composition 4 was used in place of the composition 1, an organic thin film solar cell was prepared, and photoelectric conversion efficiency was measured. The measurement results are shown in Table 1.

Example 3

Preparation and Evaluation of Organic Thin Film Solar Cell

In the same manner as in Example 1, except that the composition 5 was used in place of the composition 1, an organic thin film solar cell was prepared, and photoelectric conversion efficiency was measured. The measurement results are shown in Table 1.

Evaluation Example 1

Measurement of Area of p-n Junction by TEM Two-Dimensional Observation

On a glass substrate, the composition 1 was applied by spin coating to obtain a layer corresponding to an active layer (film thickness of about 100 nm) of an organic thin film solar cell. Then, the coated glass substrate was dried under vacuum for 1 hour. The degree of vacuum was 1 to 9×10⁻³ Pa. Next, by TEM two-dimensional observation, the length of a boundary between a p-type semiconductor and an n-type semiconductor in the layer was measured. Using TEM JEM2200FS (manufactured by JEOL Ltd.) at an accelerating voltage of 200 kV, the layer in a range from 900 nm×900 nm was observed from above the layer, and the layer in a range from 800 nm×800 nm among the above range was used for the measurement of the area. Isolated observation of a p-type semiconductor portion and an n-type semiconductor component was carried out by obtaining mapping images of sulfur atoms by a three-window method. Using a three-dimensional analysis software 3D•BON manufactured by Ratoc System Engineering Co., Ltd., the obtained images were binarized by converting a phase containing a polymer compound as a bright portion into a white tone and converting a phase containing C60PCBM as a dark portion and the area of the p-n junction per 1 µm$^3$ in the layer was determined. The measurement results are shown in Table 1.

Evaluation Example 2

Measurement of Area of p-n Junction by TEM Two-Dimensional Observation

In the same manner as in Evaluation Example 1, except that the composition 2 was used in place of the composition 1, the area of the p-n junction per 1 µm$^3$ in the layer was determined. The measurement results are shown in Table 1.

Evaluation Example 3

Measurement of Area of p-n Junction by TEM Two-Dimensional Observation

On a glass substrate, the composition 3 was applied by spin coating to obtain a layer corresponding to an active layer (film thickness of about 100 nm) of an organic thin film solar cell. Then, the coated glass substrate was dried under vacuum for 1 hour. The degree of vacuum was 1 to 9×10⁻³ Pa. Next, by TEM two-dimensional observation, the length of a boundary between a p-type semiconductor and an n-type semiconductor in the layer was measured. Using TEM JEM2200FS (manufactured by JEOL Ltd.) at an accelerating voltage of 200 kV, the layer in a range from 900 nm×900 nm was observed from above the layer, and the layer in a range from 800 nm×800 nm among the above range was used for the measurement of the area. Isolated observation of a p-type semiconductor portion and an n-type semiconductor component was carried out by obtaining 20 eV energy loss images.

It was confirmed in advance that the same contrast as that of mapping images of sulfur atoms is obtained in 20 eV energy loss images. Using a three-dimensional analysis software 3D•BON manufactured by Ratoc System Engineering Co., Ltd., the obtained images were binarized by converting a phase containing a polymer compound as a bright portion into a white tone and converting a phase containing C60PCBM as a dark portion and the area of the p-n junction per 1 µm$^3$ in the layer was determined. The measurement results are shown in Table 1.

Evaluation Example 4

Measurement of Area of p-n Junction by TEM Two-Dimensional Observation

In the same manner as in Evaluation Example 1, except that the composition 4 was used in place of the composition 1, the area of the p-n junction per 1 µm³ in the layer was determined. The measurement results are shown in Table 1.

Evaluation Example 5

Measurement of Area of p-n Junction by TEM Two-Dimensional Observation

In the same manner as in Evaluation Example 3, except that the composition 5 was used in place of the composition 3, the area of the p-n junction per 1 µm³ in the layer was determined. The measurement results are shown in Table 1.

TABLE 1

| Compositions used | Photoelectric conversion efficiency (%) | Area of p-n junction per 1 µm² by TEM two-dimensional observation (µm²) |
|---|---|---|
| (Example 1) Composition 1 | 3.0 | 116 |
| (Example 2) Composition 2 | 2.1 | 111 |
| (Comparative Example 1) Composition 3 | 1.8 | 94 |
| (Comparative Example 2) Composition 4 | 1.1 | 85 |
| (Example 3) Composition 5 | 3.6 | 119 |

As is apparent from Table 1, when an area of a p-n junction per 1 µm³ is 100 µm² or more, photoelectric conversion efficiency is high.

INDUSTRIAL APPLICABILITY

The organic photoelectric conversion element of the present invention exhibits high photoelectric conversion efficiency, and therefore the present invention is industrially very useful.

The invention claimed is:

1. A photoelectric conversion element comprising an anode, a cathode, and an active layer between the anode and the cathode, wherein the active layer comprises a mixture of an n-type semiconductor and a p-type semiconductor, and an area of a p-n junction between the n-type semiconductor and the p-type semiconductor is 115 to 300 µm² per 1 µm³ of the active layer, wherein the p-n junction is formed in the active layer by phase separation between the n-type semiconductor and the p-type semiconductor, and wherein the area is determined by a two dimensional observation of an active layer using a transmission electron microscope (TEM).

2. The photoelectric conversion element according to claim 1, wherein the active layer contains a polymer compound.

3. The photoelectric conversion element according to claim 2, wherein the active layer contains a fullerene derivative and a polymer compound.

4. The photoelectric element according to claim 2, wherein the thickness of the active layer is 5 nm to 500 nm.

5. The photoelectric conversion element according to claim 2, wherein the active layer is an organic thin film that contains a conjugated polymer compound and a fullerene derivative, wherein the conjugated polymer compound contains, as a repeating unit, one or more groups selected from the group consisting of an unsubstituted or substituted fluorenediyl group, an unsubstituted or substituted benzofluorenediyl group, a dibenzofurandiyl group, an unsubstituted or substituted dibenzothiophenediyl group, an unsubstituted or substituted carbazolediyl group, an unsubstituted or substituted thiophenediyl group, an unsubstituted or substituted furandiyl group, an unsubstituted or substituted pyrrolediyl group, an unsubstituted or substituted benzothiadiazolediyl group, an unsubstituted or substituted phenylenevinylenediyl group, an unsubstituted or substituted thienylenevinylenediyl group, and an unsubstituted or substituted triphenylaminediyl group, the repeating unit being bound to another repeating unit directly or via a linking group.

6. The photoelectric element according to claim 2, wherein the thickness of the active layer is 100 nm to 200 nm.

* * * * *